US011663124B2

(12) United States Patent
Rehmeyer et al.

(10) Patent No.: US 11,663,124 B2
(45) Date of Patent: *May 30, 2023

(54) APPARATUSES AND METHODS FOR INTERFACING ON-MEMORY PATTERN MATCHING

(71) Applicant: MICRON TECHNOLOGY, INC., Boise, ID (US)

(72) Inventors: James S. Rehmeyer, Boise, ID (US); Libo Wang, Boise, ID (US); Anthony D. Veches, Boise, ID (US); Debra M. Bell, Boise, ID (US); Di Wu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 409 days.

This patent is subject to a terminal disclaimer.

(21) Appl. No.: 16/800,356

(22) Filed: Feb. 25, 2020

(65) Prior Publication Data

US 2021/0263847 A1    Aug. 26, 2021

(51) Int. Cl.
*G06F 11/00* (2006.01)
*G06F 12/06* (2006.01)
*G06F 16/2455* (2019.01)
*G06F 11/10* (2006.01)

(52) U.S. Cl.
CPC ...... *G06F 12/0646* (2013.01); *G06F 11/1068* (2013.01); *G06F 16/24558* (2019.01); *G06F 2212/70* (2013.01)

(58) Field of Classification Search
CPC ............. G06F 12/0646; G06F 11/1068; G06F 16/24558; G06F 2212/70; G06F 11/1048;
(Continued)

(56) References Cited

U.S. PATENT DOCUMENTS

| 5,638,317 A | 6/1997 | Tran | |
| 2004/0190357 A1* | 9/2004 | Scheuerlein | G11C 29/78 365/222 |

(Continued)

OTHER PUBLICATIONS

ISR/WO dated Jun. 1, 2021 for PCT Application No. PCT/US2021/017228, pp. all.

(Continued)

*Primary Examiner* — Albert Decady
*Assistant Examiner* — Osman M Alshack
(74) *Attorney, Agent, or Firm* — Dorsey & Whitney LLP

(57) ABSTRACT

Embodiments of the disclosure are drawn to apparatuses, systems, methods, and memories that are capable of performing pattern matching operations within a memory device. The pattern matching operations may be performed on data stored within the memory based on a pattern stored in a register. The result of the pattern matching operation may be provided by the memory. The data may be retrieved from a memory array for the pattern matching operation by a read operation, a refresh operation, an error correction operation, and/or a pattern matching operation. The data may be retrieved from incoming data input lines instead of or in addition to the memory array. How the data is stored or retrieved for pattern matching operations may be controlled by a memory controller.

25 Claims, 5 Drawing Sheets

(58) Field of Classification Search
CPC .............. G11C 11/406; G11C 11/4093; G11C 11/4096; G11C 15/04
USPC .................................................. 714/763, 764
See application file for complete search history.

(56) References Cited

U.S. PATENT DOCUMENTS

| | | | |
|---|---|---|---|
| 2008/0025073 A1 | 1/2008 | Arsovski | |
| 2009/0099202 A1* | 4/2009 | Shirouzu | A61P 17/00 514/738 |
| 2009/0103376 A1* | 4/2009 | Kanda | G11C 29/48 365/201 |
| 2010/0195384 A1* | 8/2010 | Sharon | G11C 29/16 365/201 |
| 2011/0085364 A1* | 4/2011 | Shimano | G11C 15/04 365/49.17 |
| 2015/0279466 A1* | 10/2015 | Manning | G11C 7/1006 365/49.17 |
| 2016/0321000 A1* | 11/2016 | Tuers | G11C 16/3418 |
| 2016/0350178 A1* | 12/2016 | Lien | G06F 11/1048 |
| 2017/0255383 A1* | 9/2017 | Chang | G06F 11/106 |
| 2018/0033489 A1* | 2/2018 | Son | G06F 13/1673 |
| 2018/0081774 A1* | 3/2018 | Kawamura | G11C 29/1201 |
| 2019/0333566 A1* | 10/2019 | Kim | G11C 11/40611 |

OTHER PUBLICATIONS

PCT Patent Application PCT/US21/17228 titled "Apparatuses and Methods for Interfacing On-Memory Pattern Matching" filed Feb. 9, 2021, pp. all.

\* cited by examiner

APPARATUSES AND METHODS FOR INTERFACING ON-MEMORY PATTERN MATCHING

BACKGROUND

This disclosure relates generally to memory devices, including volatile memory, such as dynamic random access memory (DRAM). Data may be stored in individual memory cells of the DRAM. The memory cells may be organized in an array of rows and columns. Each memory cell in a row may be coupled to a word line and each memory cell in a column may be coupled to a bit line. Thus, every memory cell is coupled to a word line and a bit line. Data may be provided to and retrieved from the DRAM for performing various computations by a microprocessor, graphical processing unit, or other circuitry.

A growing number of computational applications such as artificial intelligence and big data analysis require pattern matching operations. Currently, data to be searched for patterns is provided from a long term data storage device to the DRAM to a processor where pattern matching operations are performed.

DETAILED DESCRIPTION

Figure 1:
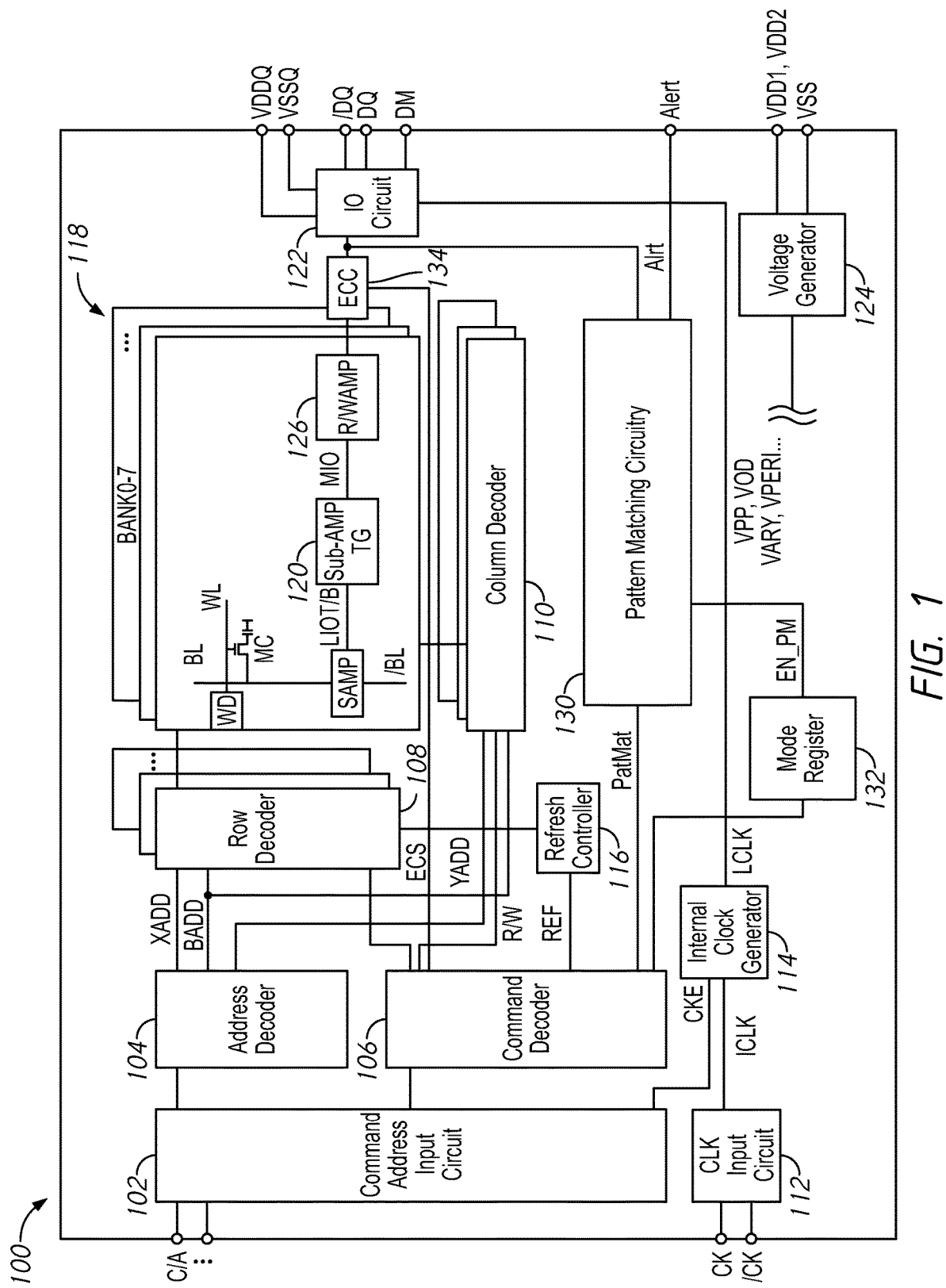
FIG. 1 is a block diagram of a semiconductor device according to embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Dynamic random access memory (DRAM) is often used to store data for performing or generated from computations performed by a microprocessor, graphical processing unit, application specific integrated circuit, and/or other circuitry (collectively referred to herein as processing circuitry). Data may be transferred to and from the DRAM from the processing circuitry and/or a long term data storage device (e.g., non-volatile memory). For example, data may be retrieved from a hard drive and provided to the DRAM. The data may then be provided to the processing circuitry from the DRAM as needed for computations performed by the processing circuitry. In some devices, providing data to and from the DRAM may be controlled by a memory controller. The memory controller may be integrated into the processing circuitry and/or a separate component in communication with the DRAM and the processing circuitry.

A growing number of computational applications such as artificial intelligence and big data analysis require pattern matching operations. For example, massive databases of genomic information may be searched for particular sequences. In another example, a neural network may be trained to search for certain features in image data to identify an object in the image. Currently, data to be searched for patterns is provided from the long term data storage device to the DRAM to the processing circuitry where pattern matching operations are performed. However, transferring the data between components may slow down the pattern matching computations in some applications. Accordingly, it would be desirable to reduce the data transferred between the components.

According to embodiments of the present disclosure, a memory, such as DRAM, may include circuitry for performing pattern matching computations, referred to herein as pattern matching circuitry. In some embodiments, the pattern matching circuitry may include a comparator circuit and one or more registers in communication with the comparator circuit. The memory may receive a pattern and data to be analyzed to determine whether or not the pattern is present in the data (e.g., the data includes one or more pattern matches). The pattern matching may be performed by (e.g., on board) the memory and the data to be analyzed need not be provided outside the memory to other processing circuitry for pattern matching operations. Rather, in some embodiments, only the results of the pattern matching operations may be provided by the memory. In some applications, performing the pattern matching operations by the memory and only providing the results may reduce the time required for pattern matching operations at least because less data is transferred between the memory and the processing circuitry. In some embodiments, performing pattern matching operations by the memory may reduce power consumption by the memory and/or a system that includes the memory.

According to embodiments of the present disclosure, data for the pattern matching may be retrieved from a memory array of the memory. In some embodiments, data may be retrieved by an error correction operation. Data may be periodically pulled from the memory array for error correction. In addition to being pulled for error correction, the data may also be pulled for use in the pattern matching operation. In some embodiments, data may be retrieved by a refresh operation. Data may be periodically refreshed by activating the word lines of the memory array. In addition to activating the memory lines during the refresh operation, an internal read operation may be performed while the line is activated for refreshing to provide the data for the pattern matching operation. In some applications, retrieving data during error correction and/or refresh operations may reduce a number of commands and/or operations required to perform the pattern matching operations compared to issuing additional read commands or read compare commands to retrieve data for pattern matching operations.

According to embodiments of the present disclosure, data for the pattern matching may be retrieved from IO lines in addition to or instead of the memory array. In some embodiments, data provided to the memory with every write command may be compared to a pattern prior to or in parallel with being written to the memory array. In some embodiments, data may be provided to the memory with a write compare command. Responsive to the write compare command, the data provided with the command may be compared to the pattern without being written to the memory array.

FIG. 1 is a block diagram showing an overall configuration of a semiconductor device 100 according to at least one embodiment of the disclosure. The semiconductor device 100 may be a semiconductor memory device, such as a DRAM device integrated on a single semiconductor chip in some examples.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 in other embodiments. Although FIG. 1 illustrates only one memory array 118, it is understood that the device 100 may include multiple memory arrays 118 in other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. A selected word line WL may be driven to a desired charge by word line driver WD. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP).

Read data from the bit line BL or /BL is amplified by the sense amplifier SAMP, and provided to sub-amplifier transfer gate 120 over complementary local data lines (LIOT/B). The sub-amplifier transfer gate 120 may act as a switch to form a conductive path between the appropriate LIOT/B and appropriate shared main data lines (MIO). Read data may pass from the local data lines LIOT/B to the main data lines MIO via a conductive path provided by the sub-amplifier transfer gate 120 to a read amplifier 126, which provides the data to an IO circuit 122. Write data received from IO circuit 122 is output from a write amplifier 126 and provided to the sense amplifier SAMP over the complementary main data lines MIO, the sub-amp transfer gate 120, and the complementary local data lines LIOT/B, and written in the memory cell MC coupled to the bit line BL or /BL.

The semiconductor device 100 may employ a plurality of external terminals for transmitting and receiving information from devices external to semiconductor device 100 (e.g., outside the memory), such as a memory controller (not shown in FIG. 1). The external terminals may include command and address (C/A) terminals coupled to a command and address bus to receive commands and addresses, and a CS signal, clock terminals to receive clocks CK and /CK, data terminals DQ to provide data, an alert pin ALERT for providing an Alrt signal, and power supply terminals to receive power supply potentials VDD1, VDD2, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are provided, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line WL and a column command signal to select a bit line BL. In another example, the command decoder 106 may provide a mode register command provided to a mode register 132 to select a memory operating condition, such as a memory condition that enables pattern matching operations according to embodiments of the present disclosure.

The device 100 may receive an access command which is a read command. When an activation command is received, and row and bank addresses are timely suppled with the activation command, followed by a read command and a column address is timely supplied with the read command, read data is read from memory cells MC in the memory array 118 corresponding to the row address and column address. The read command is received by the command decoder 106 (e.g., command controller), which provides internal commands so that read data from the memory array 118 is provided to the read amplifier 128. The read data is output to outside from the data terminals DQ via the input/output circuit 122.

The device 100 may receive an access command which is a write command. When an activation command is received, and row and bank addresses are timely suppled with the activation command, followed by a write command and a column address is timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the write amplifier 126, and by the write amplifier 126 to the memory array 118 to be written into the memory cell MC.

The device 100 may also receive commands causing it to carry out a refresh operation. The refresh signal REF may be a pulse signal which is activated when the command decoder 106 receives a signal which indicates an auto-refresh and/or other refresh command. In some embodiments, the refresh command may be externally issued to the memory device 100. In some embodiments, the refresh command may be periodically generated by a component of the device 100. The refresh signal REF is provided to the refresh controller 116. A refresh command provided to the refresh controller 116 may cause the device 100 to carry out refresh operations for one or more of the memory banks.

The refresh control circuit 116 supplies a refresh row address RXADD to the row control circuit 108, which may refresh one or more word lines WL indicated by the refresh row address. The refresh control circuit 116 may control a timing of the refresh operation based on the refresh signal. Responsive to an activation of the refresh signal, the refresh control circuit 116 may generate and provide one or more refresh addresses.

One type of refresh operation may be an auto-refresh operation. Responsive to an auto-refresh operation the device 100 may refresh a word line or a group of word lines of the memory array 118, and then may refresh a next word line or group of word lines of the memory responsive to a next auto-refresh operation. The refresh control circuit 116 may provide an auto-refresh address as the refresh address which indicates a word line or a group of word lines in the memory array 118. The refresh control circuit 116 may generate a sequence of refresh addresses such that over time the auto-refresh operation may cycle through all the word lines of the memory array 118.

The device 100 may include error correction circuitry (ECC) 134 for detection and correction of errors in data written to and read from the memory array 118. The memory array 118 may include regions dedicated to storing parity information or device 100 may include an additional array for storing parity information (not shown). The ECC 134 may receive data from the memory array 118 and the parity information. When the ECC 134 detects an error in the data, the ECC 134 may correct the error and rewrite the corrected data back to the memory array 118. The ECC 134 may detect and correct errors responsive to read and/or write commands provided by the command decoder 106. In The ECC 134 may periodically retrieve data from the memory array 118 to detect and correct errors in the memory array independent of read and/or write commands. For example, the command decoder 106 may periodically issue an error correction signal ECS to the ECC 134. Similar to the auto-refresh operation described above, the ECC 134 may cycle through all of the word lines of the memory array 118 over a series of error correction signals.

A mode register 132 may be used to define various modes for the device 100. The mode register 132 may retain the stored information until it is reprogrammed, reset, or the device 100 loses power. The mode register 132 may be programmed via a mode register write command. The mode register 132 may include one or more registers for storing information related to different memory operations or configurations. For example, the mode register 132 may be used to set burst length, burst type, latency, frequency set point, enable programmable termination components, enable certain memory operations, as well as others. The mode register 132 may also be programmed with information that can be read to provide status information about the device 100. For example, the mode register 132 may be used to provide a ready status, calibration status, as well as other status information. The information that is read may be programmed by circuits of the device 100. The mode register 132 may be read via a mode register read command. Reading the mode register 132 allows information about the status of operations and configurations to be provided by the device 100.

According to embodiments of the present disclosure, the mode register 132 may be used to specify a mode of operation in which pattern matching operations are performed by pattern matching circuitry 130. For example, when a particular value is written to the mode register 132, pattern matching operations may be implemented by the pattern matching circuitry 130 using signals provided to the memory, and when a different particular value is written to the mode register 132, the pattern matching operations may not occur (e.g., the pattern matching circuitry 130 may be disabled). A pattern matching operation may be performed by the pattern matching circuitry 130 in response to a one or more pattern matching commands in some embodiments. When the mode register 132 is programmed to enable pattern matching operations, the mode register 132 may provide a control signal EN_PM that enables pattern matching circuitry 130, which may include one or more registers and one or more comparator circuits (not shown in FIG. 1). When the pattern matching circuitry 130 is enabled by the control signal EN_PM from the mode register 132, the pattern matching circuitry 130 may respond to one or more pattern matching commands PatMat provided by the command decoder 106. Responsive to the one or more pattern matching commands, the pattern matching circuitry 130 may store a pattern in a register, perform, for example, with a comparator circuit, a pattern matching operation on data stored in the memory array 118 and/or data received from IO circuit 122 to determine if the pattern is present in the data stored in the memory array 118, write a result of the pattern matching operation to a register, alter data in the memory array 118 based on the result of the pattern matching operation, provide the result from the register to the IO circuit 122, and/or provide an alert signal Alrt to an alert pin.

The pattern matching circuitry 130 may form an integral part of the device 100. For example, the pattern matching circuitry 130 may be formed in a same semiconductor die as the memory array 118. In some examples, the pattern matching circuitry 130 may be on a same printed circuit board as the memory array 118. In this manner, the pattern matching circuitry may be closer to a memory array than a processor or host device may be. For example, a latency or access time between the pattern matching circuitry 130 and the memory array 118 may be expected to be less than a latency or access time for passing data from the memory array 118 to output pins or ports (e.g., external terminals) of the device 100, such as if the data were provided to a processor or host.

According to embodiments of the present disclosure, data from the memory array 118 may be provided to the pattern matching circuitry 130 responsive to a read command and/or an internal read command. By "internal read" it is meant that data is retrieved from the memory array 118, but the data remains on device 100. That is, the data is not transmitted external to the memory, for example, via data terminals 24. For example, responsive to a read compare command, data may be provided from the memory array 118 to pattern matching circuitry 130.

According to embodiments of the present disclosure, during an a refresh operation, in addition to activating the word lines to refresh the data stored therein, the data may be provided to the pattern matching circuitry 130 for pattern matching operations. That is, during the refresh operation, the data may be internally read by the device 100 when the word lines are activated for refreshing. According to embodiments of the present disclosure, during error correction operations, in addition to being provided to the ECC 134, the data may be provided to the pattern matching circuitry 130 for pattern matching operations. In some embodiments, data for pattern matching operations may be provided to the pattern matching circuitry 130 responsive to both refresh operation and error correction operations. The manner of providing data for pattern matching operations may be defined by one or more pattern matching commands provided by the command decoder 106.

In some embodiments, the source of data or patterns for pattern matching operations may be defined by one or more pattern matching commands provided by the command decoder 106. In some embodiments, the source of the pattern may be from the data terminals 24 via IO circuit 122, the memory array 118, and/or a second memory array (not shown). In some embodiments, the data for the pattern matching operations may be received via the data terminals 24 via IO circuit 122 responsive to a write compare command. During a write compare operation, data is received from the data terminals 24 and provided to the pattern matching circuitry 130 for performing the pattern matching operation however, the data is not written to the memory array 118.

In some embodiments, mode register commands, pattern matching commands, and/or other commands provided by the command decoder 106 may be responsive to commands (e.g., control signals) received from a memory controller (not shown in FIG. 1, see FIG. 3) external to the device 100. In some embodiments, data may be received from and provided to the memory controller.

Power supply terminals of device 100 are supplied with power supply potentials VDD1, VDD2, and VSS. The power supply potentials VDD1, VDD2, and VSS are supplied to an internal voltage generator circuit 124. The internal voltage generator circuit 124 generates various internal potentials VPP, VOD, VARY, VPERI, and the like based on the power supply potentials VDD1, VDD2, and VSS supplied to the power supply terminals. While the various internal potentials and power supply potentials may be used for any of the different circuits of the device 100, the internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

The components of semiconductor device 100 (e.g., command decoder 106, mode register 132, pattern matching circuitry 130) may transmit and/or receive information with other components of semiconductor device 100 without accessing the external terminals (e.g., C/A, DQ). In some embodiments, the components may be coupled to one another by conductive traces for transmitting and/or receiving information (e.g., the PatMat line, EN_PM line, XADD line). Components that can communicate with other components of semiconductor device 100 without accessing the external terminals may be considered on semiconductor device 100 (e.g., "on memory" or "of the memory" when semiconductor device 100 is a memory device) and other components or devices that must access the external terminals of semiconductor device 100 to communicate with components of semiconductor device 100 may be considered off and/or outside semiconductor device 100 (e.g., "off memory" when semiconductor device 100 is a memory device).

Figure 2:
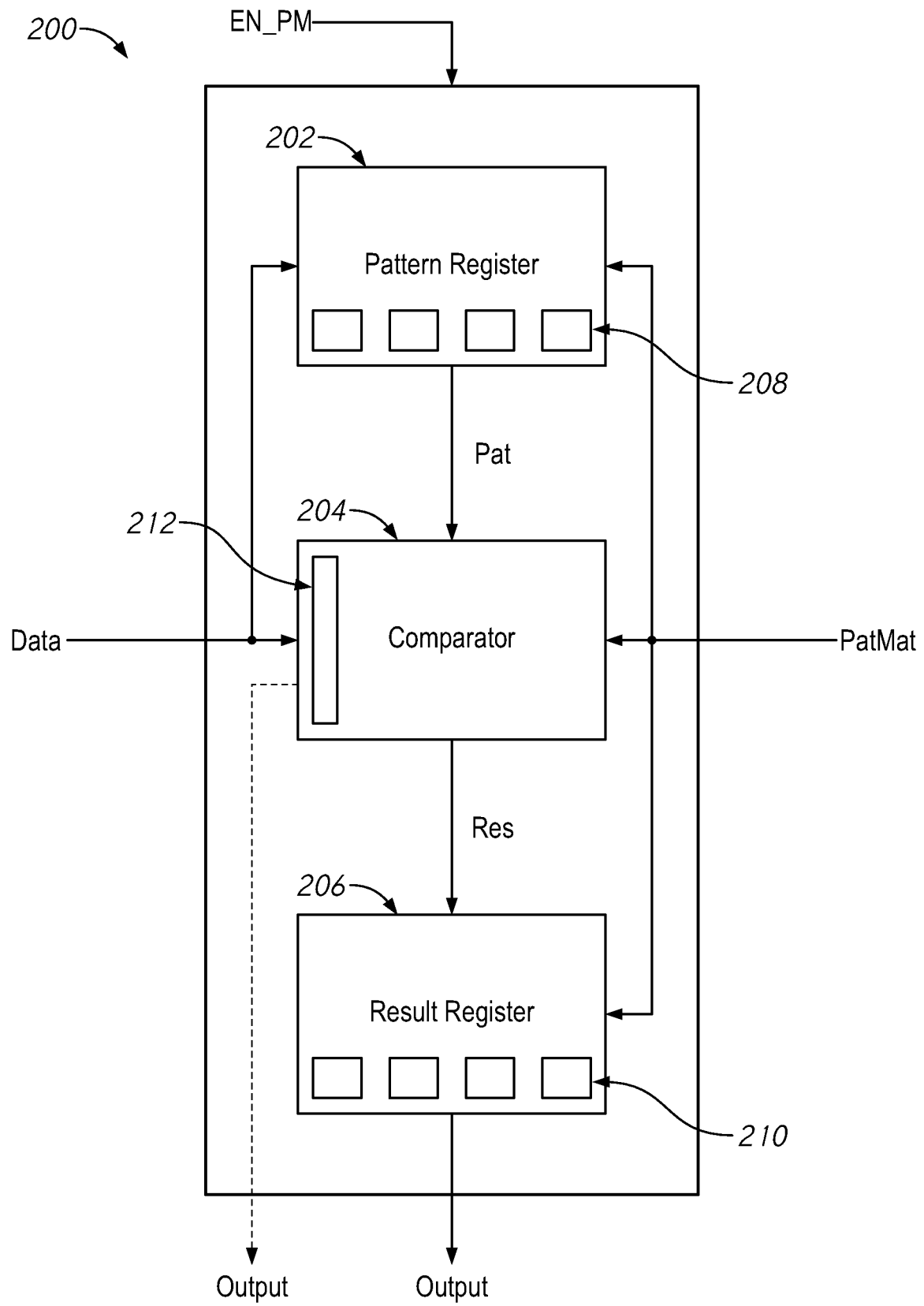
FIG. 2 is a block diagram of pattern matching circuitry according to embodiments of the present disclosure.

FIG. 2 is a block diagram of pattern matching circuitry 200 according to embodiments of the present disclosure. In some embodiments, pattern matching circuitry 200 may be included in pattern matching circuitry 130 shown in FIG. 1. The pattern matching circuitry 200 may include a pattern register 202, a comparator 204, and a result register 206.

The pattern matching circuitry 200 may be enabled by a control signal EN_PM. In some embodiments, the control signal may be provided by a mode register, such as mode register 132. The pattern matching circuitry 200 may receive one or more pattern matching commands PatMat. In some embodiments, the pattern matching commands PatMat may be provided by a command decoder, such as command decoder 106. The pattern matching circuitry 200 may receive data, which may be provided to the pattern register 202 and/or comparator 204. The data may be provided from a memory array, such as memory array 118 and/or an IO circuit such as IO circuit 122.

The pattern register 202 may store one or more patterns to be used in a pattern matching operation. In some embodiments, the pattern register 202 may include multiple registers 208. Each register 208 may store one or more patterns. In some embodiments, the pattern register 202 may be implemented using a multipurpose register (MPR). In these embodiments, a pattern may be written to the pattern register 202 using an MPR write command. In other embodiments, a pattern may be written to the pattern register 202 responsive to a pattern register write command.

The comparator 204 may receive the pattern Pat from the pattern register 202 and data. The comparator 204 may perform a pattern matching operation to determine if the data includes Pat. In some embodiments, the comparator 204 may perform pattern matching operations for multiple patterns Pat, for example, when pattern register 202 includes more than one pattern. The pattern matching operations on multiple patterns may be performed sequentially or in parallel. In some embodiments, the comparator 204 may be hard coded to perform a single type of pattern matching operation. In other embodiments, the comparator 204 may be programmed (e.g., via a pattern matching command PatMat) to perform a particular type of pattern matching operation. The type of pattern matching operation may determine a type of comparison performed (e.g., find exact matches of Pat, find matches within a certain percentage of Pat, if Pat is a vector, find vectors in the data within a certain distance of the vector). Based on the determination of the pattern matching operation, the comparator may generate a result Res. In some embodiments, Res may include a count value of a number of times Pat is present in the data, a memory address of a location of a match of Pat in the data, a flag, and/or a combination thereof.

In some embodiments, the type of pattern matching operation may define the type of result generated as Res and/or other actions to be taken by the pattern matching circuitry 200 based on the result of the pattern matching operation. For example, in some embodiments, the pattern matching circuitry 200 may delete contents of the memory array where the data matches Pat or writing a pre-determined value to the memory array where the data matches Pat.

In some embodiments, the pattern matching command PatMat may define a source from which data is retrieved from for the pattern matching operation (e.g., the memory array and/or IO lines). In some embodiments, the pattern matching command PatMat may define a manner in which the data is retrieved such as via read operations, read compare operations, error correction operations, refresh operations, and/or write operations. For example, the pattern matching command PatMat may cause the pattern matching circuitry 200 to retrieve data from the memory array and search the entire array for a given pattern as part of a pattern matching operation. In another example, the pattern matching command PatMat may cause the pattern matching circuitry 200 to perform pattern matching operations on data received from the memory array responsive to read operations and/or data received from IO lines responsive to write operations. In this example, the memory may take advantage of existing commands and/or operations, which may reduce the time utilized by pattern matching operations. In some embodiments, the pattern matching command PatMat may define a number of operations performed to retrieve the data prior to performance of the pattern matching operation. For example, PatMat may indicate that data is to be received from the memory array responsive to a refresh operation. However, the refresh operation may only refresh one word line at a time, but a pattern to be matched may include data equivalent to four word lines. Thus, PatMat may further indicate that the pattern matching circuitry 200 may wait for four refresh operations prior to performing the pattern matching operation. In some embodiments, the pattern matching circuitry 200, and/or the comparator 204 of the pattern matching circuitry 200, may include a buffer 212 for storing the data received by the prior operations.

In some embodiments, the comparator 204 may include comparator logic such as a plurality of XOR logic circuits. The number of logic circuits may be based, at least in part, on a length (e.g., number of bits) in the pattern to be matched. In some embodiments, the comparator 204 may include one or more content addressable memory (CAM) cells. Other logic circuits or other circuit components (e.g., operational amplifiers) may be included in the comparator 204 in some embodiments.

The result register 206 may store one or more results Res output by the comparator 204 responsive to the pattern matching operation. In some embodiments, the result register 206 may include multiple registers 210. Each register 210 may store one or more results. In some embodiments, the result register 206 may include a multipurpose register (MPR). In these embodiments, a result register 206 may be read using an MPR read command. In other embodiments, a result may be read from the result register 206 responsive to a result register read command. In some embodiments, the result may be provided as Output. In some embodiments, the result register 206 may provide the Output to an IO circuit, such as IO circuit 122. In some embodiments, the result register 206 may provide the Output to the memory array. In some embodiments, the result register 206 may generate a signal, such as an alert signal as the Output. The alert signal may be provided to an alert pin (see FIG. 1) in some embodiments.

Optionally, in some embodiments, the comparator 204 may provide the Output in addition to or instead of the result register 206. In these embodiments, the result register 206 may be omitted.

Figure 3:
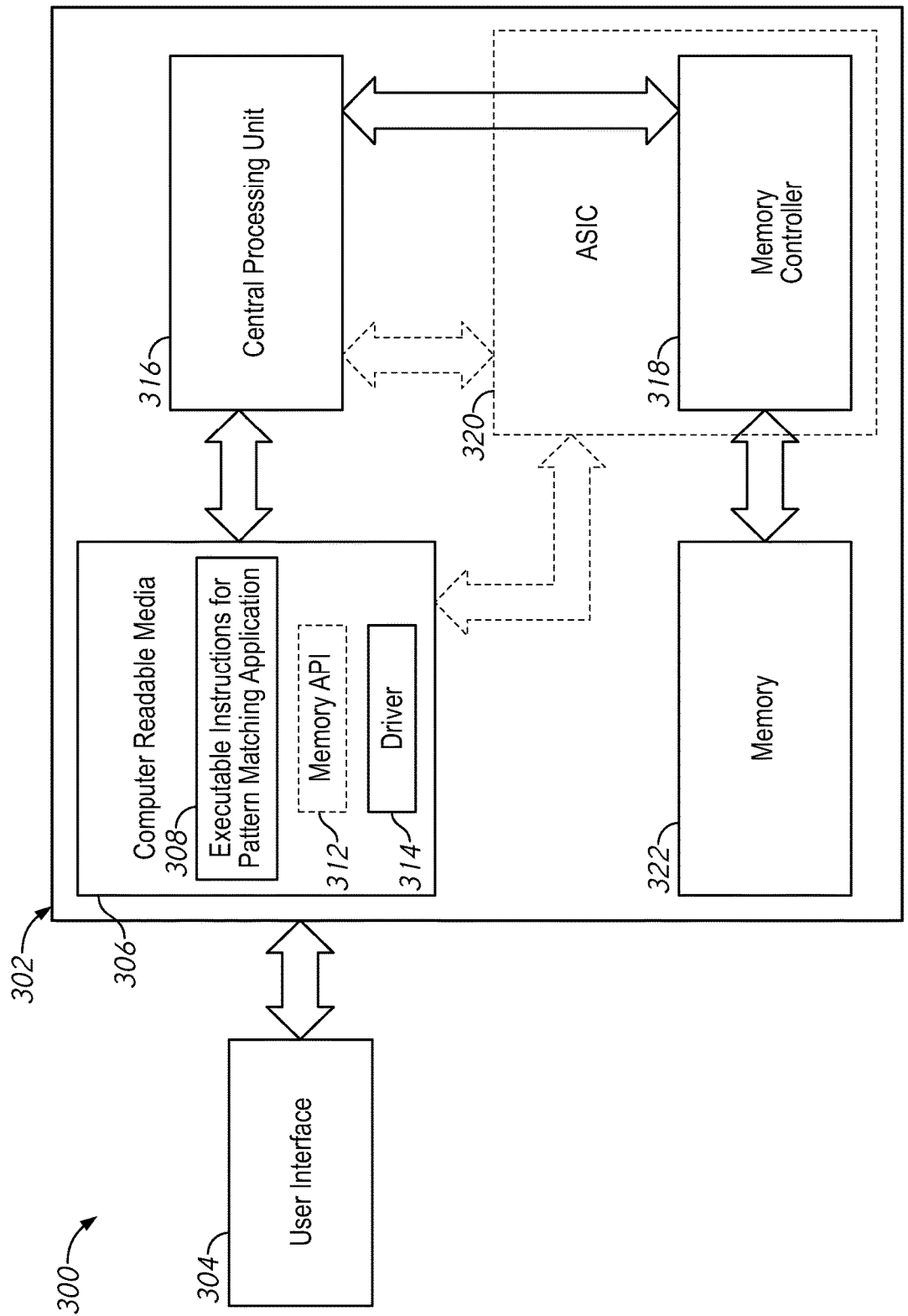
FIG. 3 is a block diagram of a system according to embodiments of the present disclosure.

FIG. 3 is a block diagram of a system 300 according to embodiments of the present disclosure. The system 300 may include a computing device 302 and a user interface 304. The computing device 302 may include computer readable media 306, a central processing unit (CPU) 316, a memory controller 318, and a memory 322. In some embodiments, the computing device 302 may further include an application specific integrated circuit (ASIC) 320. In some embodiments, the computing device 302 may include the ASIC 320 instead of the CPU 316. While a CPU is illustrated in FIG. 3, generally any number or kind of processor(s) may be used. In some embodiments, when the computing device 302 includes the ASIC 320, the memory controller 318 may be integrated with the ASIC 320. In other embodiments, the memory controller 318 may be separate from the ASIC 320. In some embodiments, the memory 322 may include at least a portion of device 100 and/or pattern matching circuitry 200.

The user interface 304 may provide outputs of the computing device 302 to a user and provide inputs from the user to the computing device 302. In some embodiments, the user interface 304 may include a display (e.g., LCD, CRT) and/or speakers for providing outputs. In some embodiments, the user interface 304 may include user controls for providing inputs such as a keyboard, touch screen, keyboard, mouse, and/or track pad.

The computer readable media 306 may be implemented using any media, including non-transitory computer readable media. Examples include memory, read only memory (RAM), read only memory (ROM), volatile or non-volatile memory, hard drive, solid state drives, or other storage. While a single computer readable media 306 is shown in FIG. 3, multiple media may be present and the executable instructions described herein may be provided on one or more computer readable media. The computer readable media may be used to implement software and/or firmware components. The computer readable media 306 may be encoded with executable instructions for a pattern matching application 308. The executable instructions may be executed, for example by the CPU 316. The pattern matching application 308 may include instructions for implementing a neural network, a training program for a neural network, a big data analysis application, and/or other application. In some embodiments, the computer readable media 306 may be encoded with executable instructions for a memory application programming interface (API) 312. The memory API 312 may allow a user (e.g., another process) access and control over on-board pattern matching capabilities of the memory 322. For example, the memory API 312 may allow a user to decide whether or not the pattern matching application 308 will utilize the on-board pattern matching capabilities of the memory 322 or perform pattern matching operations on the CPU 316. In another example, the memory API 312 may allow a user to determine a type of pattern matching operation to be performed by the memory 322. In some embodiments, the memory API 312 may be included within the pattern matching application 308. In some embodiments, the pattern matching application 308 automatically determines whether and how to utilize the on-board pattern matching capabilities of the memory 322 and the memory API 312 may be omitted. In some embodiments, the computer readable media 306 may be encoded with instructions for implementing a driver 314. The driver 314 may provide instructions for an operating system of the computing device 302 for interacting with one or more components of the computing device 302 (e.g., CPU 316, memory controller 318, ASIC 320, and/or memory 322).

The CPU 316 may execute instructions encoded on the computer readable media 306. For example, instructions used to implement the pattern matching application 308. In some embodiments, the CPU 316 may include or may be replaced by one or more graphical processing units. The CPU 316 may provide and receive data from the memory 322 via the memory controller 318. The memory controller 318 may control how data is input and output from the memory 322. The memory controller 318 may issue commands to the memory 322, such as mode register write commands, read commands, write commands, and/or pattern matching operation commands.

In some embodiments, computing device 302 may include an ASIC 320 in addition to or instead of CPU 316. When the computing device 302 includes both the ASIC 320 and the CPU 316, the ASIC 320 may receive and provide signals to the CPU 316 and/or computer readable media 306. When the computing device 302 does not include the CPU 316, the ASIC 320 may perform computations responsive to instructions provided by the computer readable media 306. While in some embodiments, the ASIC 320 may have fewer computing capabilities than the CPU 316, the ASIC 320 may be smaller and/or require less power than the CPU 316. In some applications, such as mobile devices, the size and power advantages of the ASIC 320 may outweigh the computing advantages of the CPU 316. While an ASIC 320 is shown in FIG. 3, other processing circuitry may be used in other examples (e.g., one or more controllers, microcontrollers, field programmable gate array (FPGA) circuits).

While a single cell of a memory array can be accessed during a memory access operation, the memory array is typically accessed by word line, which includes multiple cells. The length of the word line (e.g., the number of memory cells in the word line) may vary based on the architecture of the memory array. When data is to be read from or written to the memory array, one or more word lines are accessed in the memory array. However, data or subunits of the data may not fit neatly into the word lines. That is, the data may only require a portion of a word line, multiple word lines, or a combination thereof (e.g., three and a half word lines or portions of multiple word lines). Thus, some portions of word lines may not be used (e.g., may not contain valid data) and/or some word lines may include data from different subunits of the data. It may be useful for pattern matching circuitry described herein to examine particular data for a pattern—however the memory 322 may not have an awareness of where the data is stored among the memory cells. Typically, the memory 322 does not have "knowledge" of the data that is stored in the memory array. Rather, the memory controller 318 keeps track of where data and/or subunits of the data are stored. The memory controller 318 also determines how the data is stored and retrieved from the memory array. That is, the memory controller 318 typically provides commands which specify how to divide the data and/or subunits of the data (e.g., a data string within the data) across the word lines of the memory array. The memory controller 318 also determines what memory cells in the word lines include valid data.

According to embodiments of the present disclosure, the memory controller 318 may determine a length or other property of a pattern to be provided to the memory 322 for pattern matching operations. Based, at least in part, on the pattern, the memory controller 318 may control how data is provided from the memory array of the memory 322 and/or provided on the IO lines of the memory 322 to a comparator circuit of the memory 322. The data may be provided to the comparator circuit such that the data provided is the same length of the pattern and corresponds to a same unit or subunit of data as the pattern.

Generally, it may be desirable for an application to search a set of candidate data strings in data stored in memory 322 for the presence of a pattern, which may include one or more data strings. The candidate data strings may desirably be stored in a particular manner in the memory based on commands provided by the memory controller 318 to facilitate retrieval and on-memory pattern matching described herein. For example, candidate data strings may in some examples be stored in such a manner that no more than one word line is used in accessing each candidate data string. For example, pattern matching application 308 may be an application for searching for a pattern of multiple base pairs in a large genetic sequence. The large genetic sequence includes multiple candidate data strings (e.g., base pairs). Data corresponding to the pattern of multiple base pairs may be provided to a pattern register of memory 322 and data corresponding to the large genetic sequence may be stored in the memory array of the memory 322. To facilitate pattern matching performed by the memory 322, the memory controller 318 may control how the data corresponding to the large genetic sequence is stored in the memory array such that data corresponding to a whole number of base pairs is stored in each word line (e.g., data corresponding to a base pair is not spread across multiple word lines). Alternatively, or in addition, the memory controller 318 may control how data is retrieved from the memory array and provided to the comparator circuit so that valid data corresponding to a set of base pairs a same length as the pattern is used for each pattern matching operation.

In some embodiments, the memory controller 318 may control the memory 322 to store the data in the memory array in a manner to facilitate pattern matching and/or provided valid data from the memory array or another source to pattern matching circuitry (e.g., pattern matching circuitry 130 and/or 200) by providing control signals (e.g., commands) to the memory 322. For example, the memory controller 318 may ensure that candidate data strings are arranged in a particular manner relative to word lines in the memory such that a complete data string may be accessed by accessing a whole number of word lines. Candidate data strings may be arranged in a manner which facilitates accessing of the candidate data strings for comparison with a particular pattern. In some embodiments, the control signals may be received by a command address input circuit and/or a command decoder, such as command decoder 106.

In some embodiments, the control signals provided by the memory controller 318 may determine whether the pattern matching circuitry of memory 322 receives the data from the memory array responsive to a refresh operation and/or an error correction operation.

When the control signal indicates data may be provided responsive to a refresh operation, the memory controller 318 may determine a number of word lines from which the pattern matching circuitry receives the data for the pattern matching operation. The number of word lines may be based on a length of the pattern to be matched or other property of the pattern, data, and/or how the memory controller 318 stored the data in the memory array. In some embodiments, the memory controller may determine a number of refresh operations performed before the pattern matching circuitry performs the pattern matching operation. The number of refresh operations may be based on a number of word lines refreshed with each refresh operation, a length of the pattern to be matched or other property of the pattern, data, and/or how the memory controller 318 stored the data in the memory array.

When the control signal indicates data may be provided responsive to an error correction operation, the memory controller 318 may determine a number of word lines from which the pattern matching circuitry receives the data for the pattern matching operation. The number of word lines may be based on a length of the pattern to be matched or other property of the pattern, data, and/or how the memory controller 318 stored the data in the memory array. In some embodiments, the memory controller may determine a number of error correction operations performed before the pattern matching circuitry performs the pattern matching operation. The number of error correction operations may be based on a number of word lines refreshed with each error correction operation, a length of the pattern to be matched or other property of the pattern, data, and/or how the memory controller 318 stored the data in the memory array.

Figure 4:
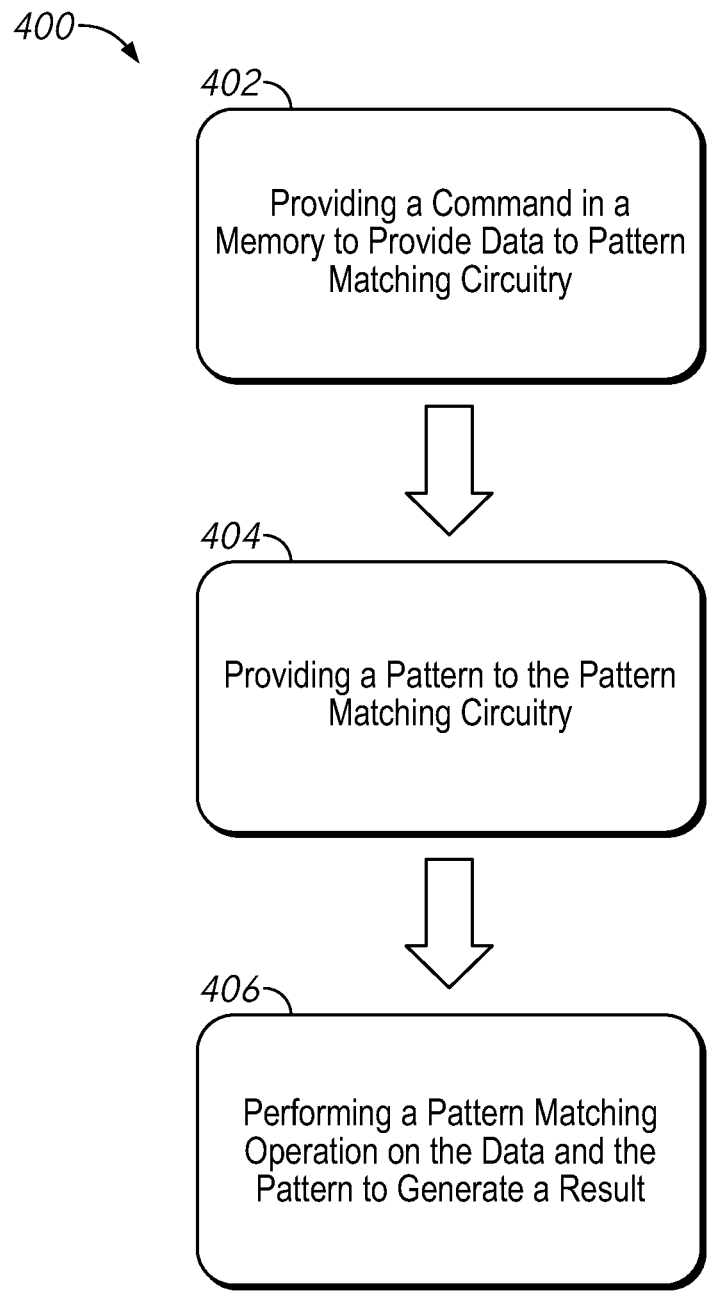
FIG. 4 is a flow chart of a method according to embodiments of the present disclosure.

FIG. 4 is a flow chart of a method 400 according to embodiments of the present disclosure. In some embodiments, at least a portion of the method 400 may be performed by the device 100, pattern matching circuitry 200, and/or system 300.

At block 402, "providing a command in a memory to provide data to pattern matching circuitry" may be performed. In some embodiments, the command may be provided by a command decoder, such as command decoder 106. In some embodiments, the command may be provided responsive to a control signal provided by a memory controller, such as memory controller 318. The pattern matching circuitry may include pattern matching circuitry 130 and/or pattern matching circuitry 200. In some embodiments, the command may cause the data to be provided from a memory array of the memory responsive to a refresh operation. The refresh operation may be performed, at least in part, by a refresh controller, such as refresh controller 116, in some embodiments. In some embodiments, the command may cause the data to be provided from a memory array of the memory responsive to an error correction operation. The error correction operation may be performed by error correction circuitry, such as ECC 134. In some embodiments, the corrected data may be provided by the ECC to the pattern matching circuitry. That is, the data provided to the pattern matching circuitry may be data on which the error correction operation has been performed. In some embodiments, the command may cause the data to be provided to the pattern matching circuitry from an IO circuit of the memory responsive to a write operation.

At block 404, "providing a pattern to the pattern matching circuitry" may be performed. The pattern may be provided from a memory array, such as memory array 118, another memory array of the memory and/or an IO circuit, such as IO circuit 122. In some embodiments, block 404 may be performed before block 402. In some embodiments, blocks 402 and 404 may be performed simultaneously or partially simultaneously. At block 406, "performing a pattern matching operation on the data and the pattern to generate a result" may be performed. The pattern matching operation may be performed by the pattern matching circuitry.

Figure 5:
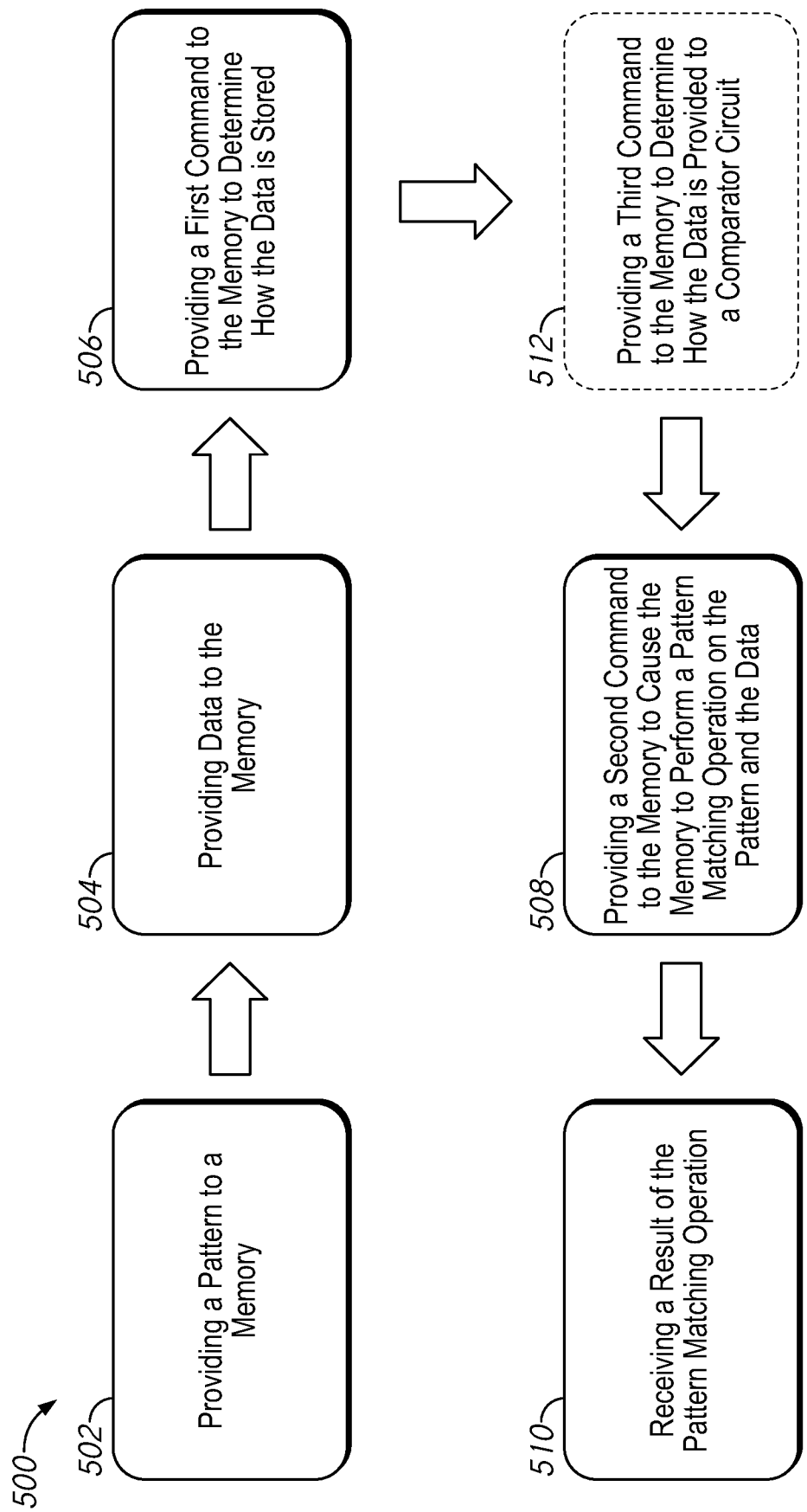
FIG. 5 is a flow chart of a method according to embodiments of the present disclosure.

FIG. 5 is a flow chart of a method 500 according to embodiments of the present disclosure. In some embodiments, at least a portion of the method 500 may be performed by the device 100, pattern matching circuitry 200, and/or system 300.

At block 502, "providing a pattern to a memory" may be performed. In some embodiments, the pattern may be stored in a register of the memory, such as pattern register 202. At block 504, "providing data to the memory" may be performed. In some embodiments, the data may be stored in a memory array, such as memory array 118. In some embodiments, block 504 may be performed before block 502. In some embodiments, blocks 504 and 502 may be performed simultaneously.

At block 506, "providing a first command to the memory to determine how the data is stored" may be performed. In some embodiments, the first command may determine how the data is stored across a plurality of word lines of the memory array. In some embodiments, block 506 may be performed prior to block 502 and/or block 504 or simultaneously with block 502 and/or block 504.

At block 508, "providing a second command to the memory to cause the memory to perform a pattern matching operation on the pattern and the data" may be performed. In some embodiments, the pattern matching operation may be performed by pattern matching circuitry of the memory, such as pattern matching circuitry 130 and/or 200. At block 510, "receiving a result of the pattern matching operation" may be performed. In some embodiments, the data, pattern, and commands may be provided to the memory by a memory controller, such as memory controller 118. In some embodiments, the memory controller may receive the result from the memory.

In some embodiments, the method 500 may further include block 512 where "providing a third command to the memory to determine how the data is provided to a comparator circuit" may be performed. The comparator circuit may be included in the pattern matching circuitry and may perform the pattern matching operation in some embodiments. The comparator circuit may include comparator circuit 204 in some embodiments. In some embodiments, block 512 may be performed simultaneously with block 506 and/or block 508.

In some embodiments, the third command may cause the data to be provided responsive to a refresh operation. The refresh operation may be performed, at least in part, by a refresh controller 116. As part of the refresh operation, the data from the refreshed word lines may be provided to the comparator circuit (e.g., amplifiers 126). In some embodiments, the third command may causes the comparator circuit to receive the data from a plurality of refresh operations prior to performing the pattern matching operation. For example, when a length of the pattern to be matched includes data that spans across more word lines than are refreshed in a single refresh operation. In some embodiments, the comparator circuit may include a buffer to store the data from the plurality of pattern matching operations.

In some embodiments, the third command causes the data to be provided responsive to an error correction operation. In some embodiments, the error correction operation may be performed, at least in part, by error correction circuitry, such as ECC 134. In some embodiments, the data may be provided to the comparator circuit via the amplifiers 126 as it is provided to the ECC during the error correction operation. In some embodiments, the data may be corrected by the ECC prior to being provided to the comparator circuit. That is, the corrected data may be provided to the comparator circuit by the ECC. In some embodiments, the third command causes the comparator circuit to receive the data from a plurality of error correction operations prior to performing the pattern matching operation, in a similar manner as discussed for refresh operations.

The apparatuses, systems, and methods described herein may allow pattern matching to be performed by a memory. The memory may retrieve data from a memory array for the pattern matching by a variety of methods, some of which may utilize existing operations that require activating word lines including the data or retrieving the data. This may allow pattern matching to be performed with fewer commands and/or operations by the memory in some embodiments. This may reduce time and/or power consumption by the memory in some applications Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative and should not be construed as limiting the appended claims to any particular embodiment or group of embodiments. Thus, while various embodiments of the disclosure have been described in particular detail, it should also be appreciated that numerous modifications and alternative embodiments may be devised by those having ordinary skill in the art without departing from the broader and intended spirit and scope of the present disclosure as set forth in the claims that follow. Accordingly, the specification and drawings are to be regarded in an illustrative manner and are not intended to limit the scope of the appended claims.

What is claimed is:

1. An apparatus comprising:
a first memory array configured to write data from and read data to a processor;
a comparator circuit on a semiconductor die that comprises the first memory array, the comparator circuit configured to:
receive the data to be written to or read from the memory array,
receive a pattern of a string of bits, and
perform a pattern matching operation that comprises comparing the data and the pattern;
a first register configured to store the pattern and provide the pattern to the comparator circuit;
a command decoder on the semiconductor die that comprises the first memory array and the comparator circuit and configured to provide commands for the pattern matching operation; and
a mode register configured to selectively, enable the comparator circuit to perform the pattern matching operations when a first value is written to the mode register and disable the comparator circuit when a second value is written to the mode register.

2. The apparatus of claim 1, further comprising a refresh controller configured to perform a refresh operation on the first memory array, wherein, based at least in part on at least one of the commands for the pattern matching operation, the first memory array is configured to provide the first data to the comparator circuit during the refresh operation.

3. The apparatus of claim 1, further comprising error correction circuitry configured to perform an error correction operation on the first data, wherein, based at least in part on at least one of the commands for the pattern matching operation, the first memory array is configured to provide the first data to the comparator circuit.

4. The apparatus of claim 3, wherein the first memory array is configured to provide the first data to the comparator circuit after the error correction operation.

5. The apparatus of claim 1, wherein at least one of the commands for the pattern matching operation is a read compare command, wherein the first data is provided from the memory array by a read operation to the comparator circuit.

6. The apparatus of claim 1, further comprising a second memory array configured to store and provide second data, wherein the second data includes the pattern received by the comparator circuit.

7. The apparatus of claim 1, wherein the pattern is provided to the first register from the first memory array.

8. The apparatus of claim 1, further comprising an IO circuit, wherein the pattern is provided to the first register from the IO circuit.

9. An apparatus comprising:
a memory included on a semiconductor die, the memory comprising:
a memory array including a plurality of word lines, wherein the memory array is configured to store data in at least some of the plurality of word lines, wherein the data includes a plurality of candidate data strings;
pattern matching circuitry configured to receive the data and a pattern, wherein the pattern matching circuitry is configured to perform a pattern matching operation that includes comparing the data to the pattern responsive to a command, Wherein the pattern includes one or more data strings; and
a mode register configured to selectively enable the pattern matching circuitry to perform the pattern matching operations when a first value is written to the mode register and disable the comparator circuit when a second value is written to the mode register; and
a memory controller external to the memory, the memory controller configured to provide control signals to the memory to:
store a candidate data string of the plurality of data strings such that an entirety of the candidate data string is retrievable by a memory access operation; and
provide one or more candidate data strings of the plurality of candidate data strings to the pattern matching circuitry from the memory array, wherein how the data is provided is based, at least in part, on a number of data strings included in the pattern,
wherein the first value or the second value is written to the mode register is based, at least in part, on the control signals provided by the memory controller.

10. The apparatus of claim 9, wherein the candidate data string of the plurality of candidate data strings is stored in a single word line of the memory array.

11. The apparatus of claim 9, wherein the control signals provided by the memory controller determine whether the pattern matching circuitry receives the data from the memory array responsive to at least one of a refresh operation or an error correction operation.

12. The apparatus of claim 9, wherein the memory further comprises a refresh controller configured to perform refresh operations on the plurality of word lines, wherein the control signals provided by the memory controller determine whether the pattern matching circuitry receives the data responsive, at least in part, to the refresh operation.

13. The apparatus of claim 12, wherein the memory controller determines a number of word lines of the plurality of word lines from which the pattern matching circuitry receives the data for the pattern matching operation, wherein the number of word lines is based, at least in part, on a number of data strings included in the pattern.

14. The apparatus of claim 12, wherein the memory controller determines a number of refresh operations performed before the pattern matching circuitry performs the pattern matching operation.

15. The apparatus of claim 9, wherein the memory further comprises error correction circuitry configured to perform error correction operations on the data stored in the plurality of word lines, wherein the control signals provided by the memory controller determine whether the pattern matching circuitry receives the data responsive, at least in part, to the error correction operation.

16. The apparatus of claim 15, wherein the memory controller determines a number of word lines of the plurality of word lines from which the pattern matching circuitry receives the data for the pattern matching operation.

17. The apparatus of claim 15, wherein the memory controller determines a number of error correction operations performed before the pattern matching circuitry performs the pattern matching operation.

18. The apparatus of claim 9, wherein the memory further comprises a command decoder configured to receive the control signals from the memory controller and issue the command to the pattern matching circuitry responsive to the control signals provided by the memory controller.

19. The apparatus of claim 18, wherein the command decoder is further configured to issue at least one of a refresh command to a refresh controller or an error correction command to error correction circuitry of the memory.

20. The apparatus of claim 9, wherein the memory further comprises an IO circuit, wherein the pattern matching circuitry is configured to provide a result of the pattern matching operation to the IO circuit and the IO circuit is configured to provide the result to the memory controller.

21. A method comprising:
providing a command to cause a first value to be written to a mode register to selectively cause the mode register to enable pattern matching circuitry on a memory to perform pattern matching operations;
providing a command in the memory to provide data to the pattern matching circuitry on the memory, wherein the command causes the data to be provided from a memory array of the memory responsive to at least one of a refresh operation or an error correction operation;
providing a pattern to a register of the pattern matching circuitry; and
performing, with the pattern matching circuitry, a pattern matching operation on the data and the pattern to generate a result.

22. The method of claim 21, wherein the data provided to the pattern matching circuitry responsive to the error correction operation is data on which the error correction operation has been performed.

23. The method of claim 21, wherein the command is provided by a command decoder of the memory and the command is provided responsive to a control signal provided by a memory controller.

24. The method of claim 21, wherein the pattern is provided by an IO circuit of the memory.

25. The method of claim 21, wherein the pattern is provided by a second memory array.

\* \* \* \* \*